United States Patent
Lee et al.

(10) Patent No.: US 9,281,264 B2
(45) Date of Patent: Mar. 8, 2016

(54) ELECTRONIC PACKAGING SUBSTRATE WITH ETCHING INDENTATION AS DIE ATTACHMENT ANCHOR AND METHOD OF MANUFACTURING THE SAME

(71) Applicant: Avago Technologies General IP (Singapore) Pte. Ltd., Singapore (SG)

(72) Inventors: Meng Ee Lee, Pulau Pinang (MY); Eng Chuan Ong, Penang (MY); Seong Choon Lim, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 291 days.

(21) Appl. No.: 13/793,949

(22) Filed: Mar. 11, 2013

(65) Prior Publication Data

US 2014/0252399 A1 Sep. 11, 2014

(51) Int. Cl.
*H01L 33/00* (2010.01)
*H01L 23/495* (2006.01)
*H01L 33/62* (2010.01)
*H01L 23/00* (2006.01)

(52) U.S. Cl.
CPC .... *H01L 23/49513* (2013.01); *H01L 23/49503* (2013.01); *H01L 23/49562* (2013.01); *H01L 24/32* (2013.01); *H01L 24/83* (2013.01); *H01L 33/62* (2013.01); *H01L 24/29* (2013.01); *H01L 2224/27013* (2013.01); *H01L 2224/2929* (2013.01); *H01L 2224/29339* (2013.01); *H01L 2224/32225* (2013.01); *H01L 2224/83192* (2013.01); *H01L 2224/83385* (2013.01); *H01L 2224/83856* (2013.01); *H01L 2224/83874* (2013.01); *H01L 2924/07802* (2013.01); *H01L 2924/12041* (2013.01); *H01L 2924/12042* (2013.01); *H01L 2933/0066* (2013.01)

(58) Field of Classification Search
CPC .......................... H01L 23/49513; H01L 33/62
USPC ............................................... 257/98, 99, 676
See application file for complete search history.

(56) References Cited

U.S. PATENT DOCUMENTS

| | | | |
|---|---|---|---|
| 2009/0072367 A1* | 3/2009 | Poddar et al. | 257/676 |
| 2009/0250796 A1 | 10/2009 | Tsui et al. | |
| 2012/0256222 A1* | 10/2012 | Sasaki et al. | 257/98 |
| 2012/0280407 A1* | 11/2012 | Do et al. | 257/778 |

OTHER PUBLICATIONS

Esfahanian, Masood, "Literature review on thermo-mechanical behavior of components for LED System-in-Package", Literature Review Report, Eindhoven University of Technology, Feb. 2012, 45 pages.

(Continued)

*Primary Examiner* — Tan N Tran (57) ABSTRACT

An electronics package is disclosed. The electronics package is disclosed as including a substrate core, a metal layer established on top of the substrate core, the metal layer being etched so as to include a die attachment anchor and at least one gap that separates a die bonding pad from at least one of a trace and wire bonding pad, for example. The die attachment anchor is established on top of the die bonding pad and has a depth that does not extend all the way through the die bonding pad.

20 Claims, 5 Drawing Sheets

(56) References Cited

OTHER PUBLICATIONS

Fillion, Ray, "Advanced Packaging Technology for Leading Edge Microelectronics and Flexible Electronics", GE Global Research, Cornell University, 197 pages.

Lin et al., "LED and Optical Device Packaging and Materials", Optoelectronics Packaging and Materials Labs, Materials for Advanced Packaging, Springer Science+Business Media, LLC, 2009, 52 pages.

* cited by examiner

ELECTRONIC PACKAGING SUBSTRATE WITH ETCHING INDENTATION AS DIE ATTACHMENT ANCHOR AND METHOD OF MANUFACTURING THE SAME

FIELD OF THE DISCLOSURE

The present disclosure is generally directed toward electronic packages and methods of attaching dies to the same.

BACKGROUND

In electronics packaging semiconductor dies are often attached directly to a packaging substrate (e.g., a Printed Circuit Board (PCB)) or to a metal bonding pad established on top of the packaging substrate. In a more specific example, most electronic packages including a Light Emitting Diode (LED) often have the LED die attached to a metal pad (e.g., a bonding pad) established on top of a substrate core. The typical process is to attach the LED die to the bonding pad with a volume of adhesive that is dotted onto the bonding pad prior to placing the LED die on the bonding pad.

The unfortunate reality is that the bond between the LED die and the bonding pad is common point for failure. For instance, when a solid metal pad is used, the solid metal pad will not form a good lamination between the adhesive and the LED die; therefore, when this package is subjected to temperature fluctuation, it may cause the LED die to delaminate from the metal pad. Other die-attaching techniques may result in the creation of air bubbles within the adhesive. Again, as the package is subjected to temperature fluctuations during operation, the air bubbles can expand, which again may result in the LED die delaminating from the metal pad.

SUMMARY

It is, therefore, one aspect of the present disclosure to provide an improved electronic package and method of manufacturing the same that overcomes the above-noted shortcomings. Specifically, an electronics package is disclosed that includes a substrate core, a metal bonding pad established on the substrate core, the metal bonding pad including a die attachment anchor established thereon, and one or more conductive traces also established on the conductive core, where each of the one or more conductive traces are constructed of the same material as the bonding pad and wherein gaps between the bonding pad and the one or more conductive traces are created at substantially the same time as the die attachment anchor.

In some embodiments, the die attachment anchor and the gaps between the bonding pad and the one or more conductive traces are created during a common etching process whereby a single metal layer of metal established on the substrate core is chemically etched to have a predetermined patter. In some embodiments, the etching mask used during the etching process is configured so that the die attachment anchor is not etched all the way through the bonding pad. In other words, while the die attachment anchor and gaps are created during the common etching process, the narrowness of the etching mask about the location of the die attachment anchor causes the die attachment anchor to have a depth that is less than a total depth or thickness of the metal layer.

By creating a die attachment anchor with a specifically controlled depth that does not extend all the way to the substrate core, the opportunity for air bubbles to exist in an adhesive that fills the die attachment anchor is minimized. Furthermore, because the die attachment anchor interrupts an otherwise flat surface of the bonding pad, the problems associated with delamination at a flat bonding surface are avoided. Thus, a die attachment anchor is created at the same time as other features of the electronics package, thereby avoiding additional costs associated with the creation of a die attachment anchor. Meanwhile, the die attachment anchor overcomes many delamination problems that are prevalent in the electronics packaging arts.

In some embodiments, a method of manufacturing an electronics package is provided. The method includes a single etching step that results in the creation of a die attachment anchor on a bonding pad as well as one or more gaps that electronically separate the bonding pad from another metal feature of the electronics package. The die attachment anchor is etched to have a depth that is less than an overall thickness of the metal in which it is etched, thereby preventing the die attachment anchor from extending all the way through the metal to the substrate core. The method continues by adding an adhesive or the like to at least a portion of the bonding pad and die attachment anchor and then placing a semiconductor die on the bonding pad and die attachment anchor. Additional steps, such as curing the adhesive, wire bonding the die to at least one lead established on the metal, and the like may also be performed.

The present disclosure will be further understood from the drawings and the following detailed description. Although this description sets forth specific details, it is understood that certain embodiments of the invention may be practiced without these specific details. It is also understood that in some instances, well-known circuits, components and techniques have not been shown in detail in order to avoid obscuring the understanding of the invention.

BRIEF DESCRIPTION OF THE DRAWINGS

The present disclosure is described in conjunction with the appended figures.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Furthermore, while embodiments of the present disclosure will describe the example of attaching an LED die to a bonding pad of an electronics package, it should be appreciated that embodiments of the present disclosure are not so limited. Specifically, the concepts and features disclosed herein can be applied to electronics packages having LED dies, non-LED dies, integrated-circuit dies, a single wafer of Electronic-Grade Silicon (EGS), any semiconductor made though processes such as photolithography, and other semiconductor dies. In other words, embodiments of the present disclosure can be utilized for any electronics package in which a die (e.g., semiconductor die, LED die, etc.) is attached, adhered, glued, fixed, and/or laminated to a bonding pad. The example of an LED die is used for illustration purposes only and should not be construed as limiting embodiments of the present disclosure.

With reference now to FIGS. 1-5, an electronics package 100 and potential methods of manufacturing the same will be described in accordance with at least some embodiments of the present disclosure. As shown in FIGS. 1A and 1B, the construction of the electronics package 100 begins by receiving a substrate core 104 (step 504) and establishing at least one metal layer 116 on top of the substrate core 104 (step 508). In some embodiments, the substrate core 104 comprises a first major surface and an opposing second major surface. The at least one metal layer 116 may be established on either major surface of the substrate core 104, although embodiments will be described in connection with establishing the metal layer 116 on a top surface of the substrate core 104. The at least one metal layer 116 may be established on the substrate core 104 using any type of known deposition or attachment process.

Figure 1A:
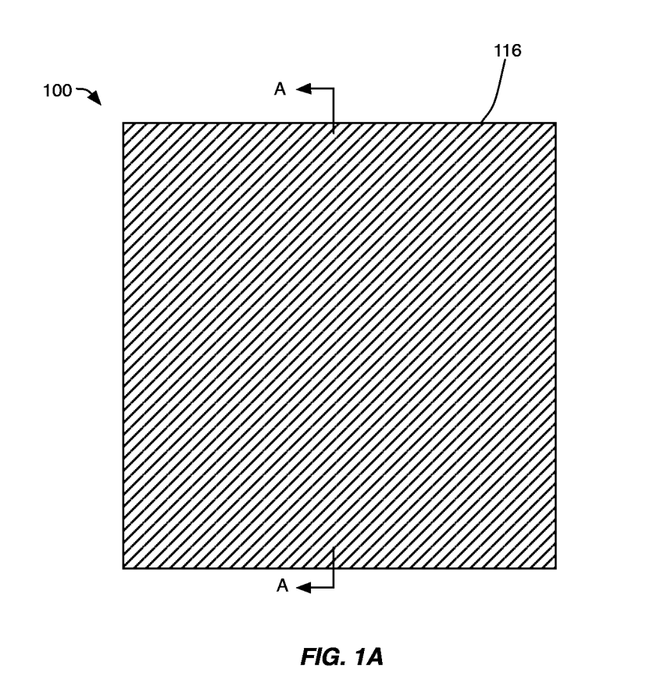
FIG. 1A is a top view of an electronics package in a first stage of manufacturing in accordance with embodiments of the present disclosure.
Figure 1B:
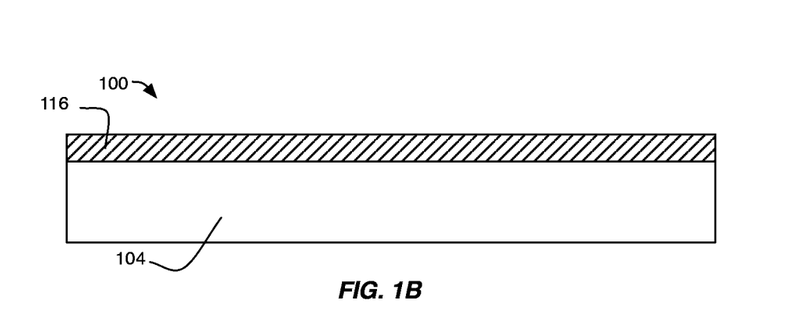
FIG. 1B is a cross-sectional view along line A-A.

As a non-limiting example, the substrate core 104 may correspond to a ceramic material or a polymer as is commonly used in PCB manufacturing. In some embodiments, the substrate core 104 may correspond to AlN or a similar type of ceramic material. In some embodiments, the substrate core 104 may correspond to FR4, Bismaleimide-triazine (BT), or any other type of resin/glass fiber laminate.

The at least one metal layer 116 established on the substrate core 104 may correspond to an electrical and/or thermally conductive material. More specific, but non-limiting examples of a metal layer 116 include copper, gold, silver, gold-plated copper, silver-plated copper, combinations thereof, or any other known type of metal or metal alloy used in the construction of electronics packages. The at least one metal layer 116 may be provided on the substrate core 104 using known deposition techniques (e.g., Chemical Vapor Deposition (CVD), Atomic Layer Deposition (ALD), etc.), sputtering, adhesive bonding, lamination, etc.

Figure 2A:
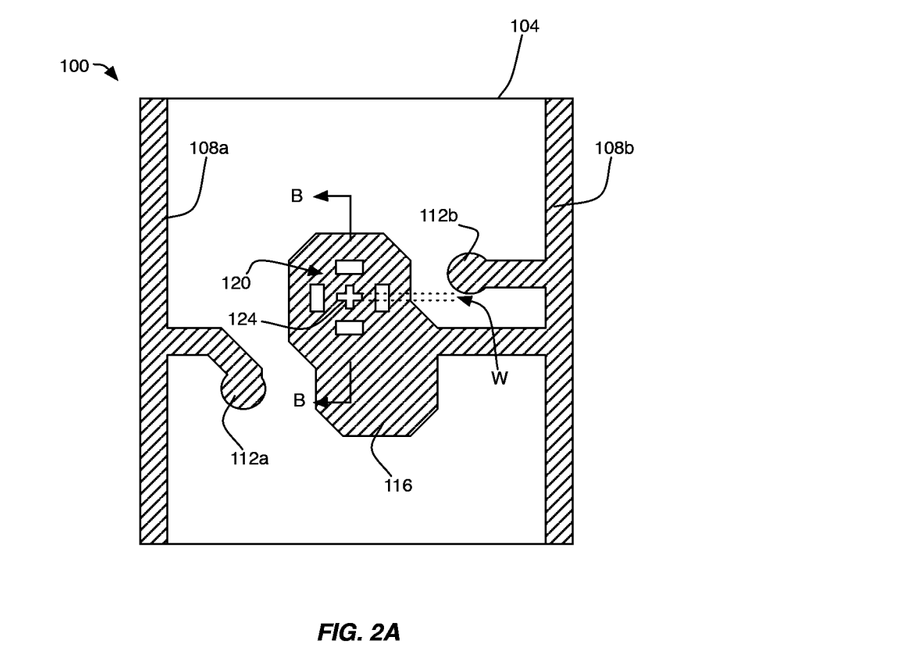
FIG. 2A is a top view of an electronics package in a second stage of manufacturing in accordance with embodiments of the present disclosure.
Figure 2B:
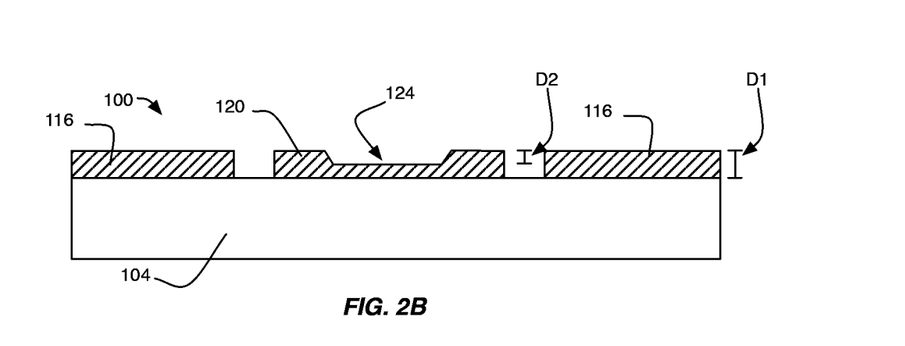
FIG. 2B is a cross-sectional view along line B-B.

Once the metal layer(s) 116 have been established on the substrate core 104, the method continues with an etching step whereby portions of the metal layer(s) 116 are removed from the electronics package 100 as shown in FIGS. 2A and 2B. Specifically, the metal layer(s) 116 may be masked with an etching mask created with a predetermined set of features have predetermined dimensions (step 512) and then the exposed portions of the metal layer(s) 116 (e.g., the portions not covered with the etching mask) may then be subjected to an etching process (step 516). During the etching process, the exposed portions of the metal layer(s) 116 are etched away due to their exposure to the etching chemical(s).

In some embodiments, the etching mask may comprise one or more voids that enable the creation of the one or more traces 108a, 108b that terminate at one or more wire bonding pads 112a, 112b. The traces 108a, 108b and/or wire bonding pads 112, 112b are also commonly referred to as leads. The chemical etching, in some embodiments, can be performed with ammonium persulfate or ferric chloride. A simple, but non-limiting example of an etching process that may be implemented is referred to as immersion etching. In this process, the substrate core 104, metal layer(s) 116 and etching mask are submerged in etching solution such as ferric chloride. Compared with methods used for mass production, the etching time is long. Heat and agitation can be applied to the bath to speed the etching rate. Another possible etching process that may be utilized in accordance with embodiments of the present disclosure is bubble etching. In bubble etching, air is passed through the etchant bath to agitate the solution and speed up etching. Yet another etching process that may be employed is spray etching. In spray etching, the etchant solution is distributed over the boards by nozzles, and recirculated by pumps. Adjustment of the nozzle pattern, flow rate, temperature, and etchant composition gives predictable control of etching rates and high production rates.

As more of the metal layer 116 is consumed from the substrate core 104, the etchant becomes saturated and less effective; different etchants have different capacities for copper, with some as high as 150 grams of copper per liter of solution. In commercial use, etchants can be regenerated to restore their activity, and the dissolved copper recovered and sold. Small-scale etching requires attention to disposal of used etchant, which is corrosive and toxic due to its metal content.

In some embodiments, the etching mask is constructed such that any gaps between a bonding pad 120 and the traces 108a, 108b is completely removed. On the other hand, the etching mask may be constructed with a limited width on top of the bonding pad to create a die attachment anchor 124. Specifically, while the metal layer(s) 116 between the bonding pad and leads may be completely removed, the portion of the metal layer 116 at the die attachment anchor 124 is not completely etched away. In other words, the etching mask may comprise an opening that is sufficiently small so as to prevent the etchant from removing all of the metal layer 116 at the die attachment anchor 124.

More specifically, the etching mask may allow the die attachment anchor 124 to only be etched to a width of W and a depth of D2 that is less than the overall depth/thickness D1 of the metal layer 116. In some embodiments, the width W of the die attachment anchor 124 is less than or equal to about 0.04 mm (e.g., 40 microns) whereas the width of the gaps between the bonding pad 120 and the other conductive components of the electrical package 100 (e.g., traces 108a, 108b, wire bonding pads 112a, 112b, etc.) is greater than or equal to about 0.10 mm (e.g., 100 microns). In further embodiments, the width W of the die attachment anchor 124 is less than or equal to about 0.03 mm (e.g., 30 microns). In still further embodiments, the width W of the die attachment anchor 124 is less than or equal to about 0.02 mm (e.g., 20 microns). Moreover, the depth D2 of the die attachment anchor 124 may be between approximately ¼ and ¾ of D1. In more specific embodiments, the depth D2 of the die attachment anchor 124 is less than ½ of D1. In some embodiments, the depth/thickness of the metal layer 116 may be approximately 0.04 mm (e.g., 40 microns), which means that the depth D2 of the die attachment anchor 124 may be less than approximately 0.02 mm (e.g., 20 microns).

Although the die attachment anchor 124 is depicted as being shaped substantially like a cross, it should be appreciated that embodiments of the present disclosure are not so limited. Specifically, the die attachment anchor 124 may assume any number of configurations without departing from the scope of the present disclosure. For instance, the die attachment anchor 124 may comprise a ring-like shape, a circular shape, a diamond shape, a square, a rectangular shape, a random pattern of lines, etc. One advantageous feature of the die attachment anchor 124 is that its thickness D2 does not extend all the way through the metal layer 116 to the substrate core 104, whereas other features created during etching extend all the way through the metal layer 116.

It should also be appreciated that while the example described herein contemplated the use of a chemical etching process to create the die attachment anchor 124, embodiments of the present disclosure are not so limited. For instance, other types of etching processes may be utilized to create the circuit features illustrated by the metal layer 116 on the substrate core 104. Furthermore, additive processes, rather than subtractive processes, may be utilized to create the die attachment anchor 124 while the metal layer 116 is being deposited on the substrate core 104. Further still, laser etching, optical etching, mechanical etching or grinding, or the like can be used to create the die attachment anchor 124 without departing from the scope of the present disclosure.

Figure 3A:
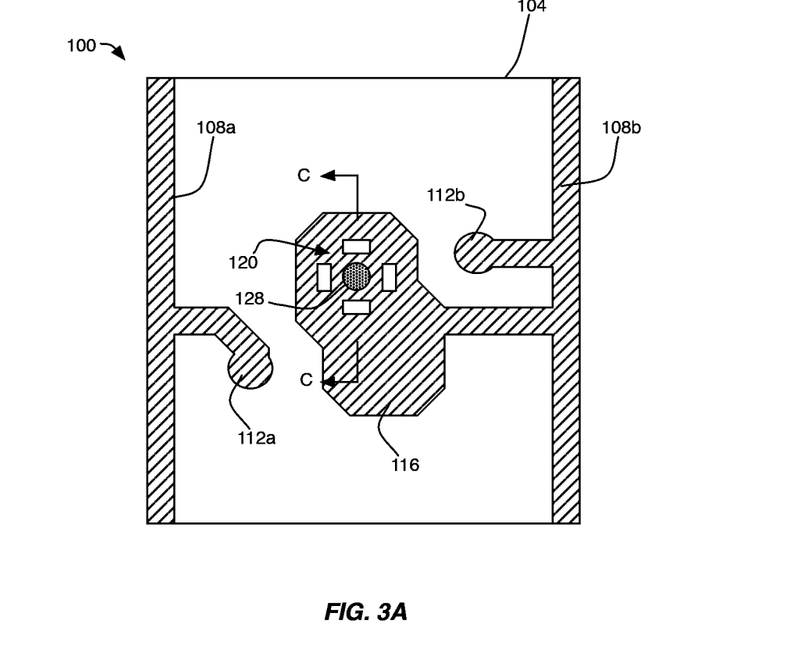
FIG. 3A is a top view of an electronics package in a third stage of manufacturing in accordance with embodiments of the present disclosure.
Figure 3B:
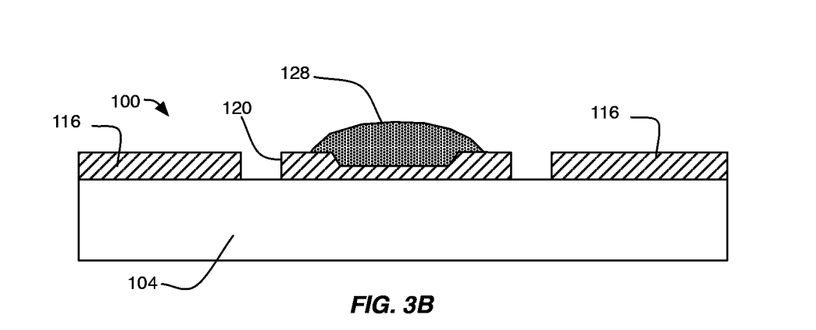
FIG. 3B is a cross-sectional view along line C-C.
Figure 4A:
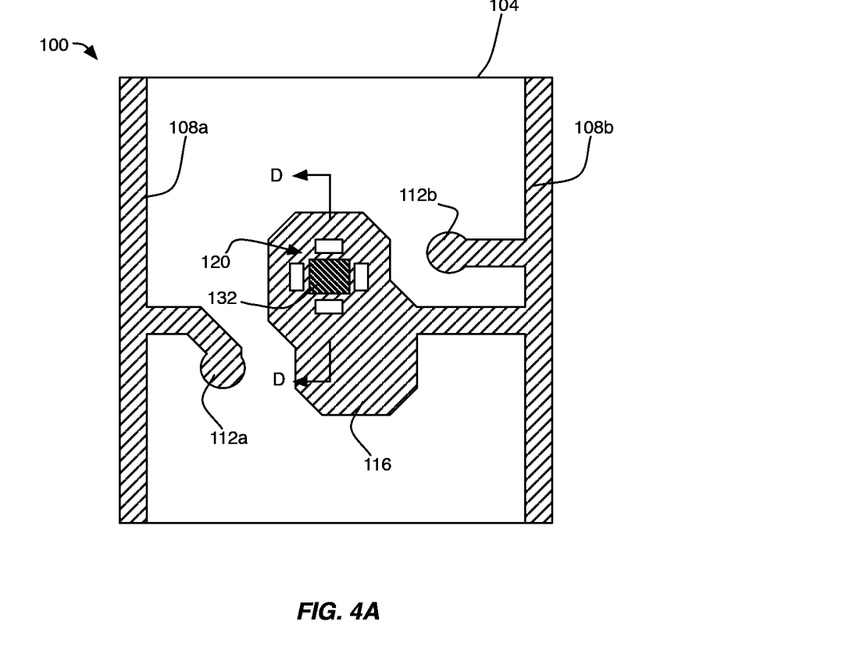
FIG. 4A is a top view of an electronics package in a fourth stage of manufacturing in accordance with embodiments of the present disclosure.
Figure 4B:
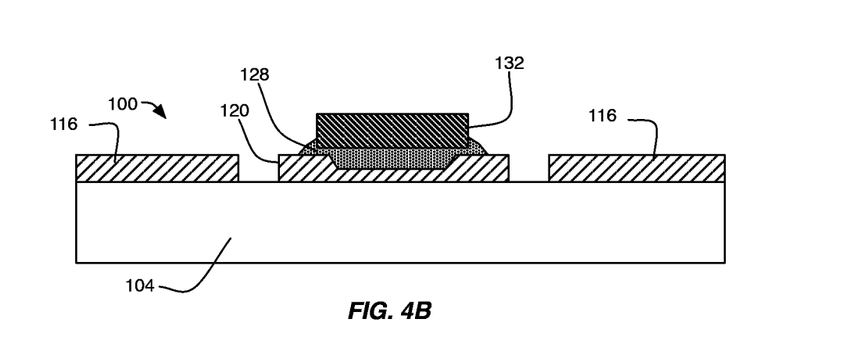
FIG. 4B is a cross-sectional view along line D-D.
Figure 5:
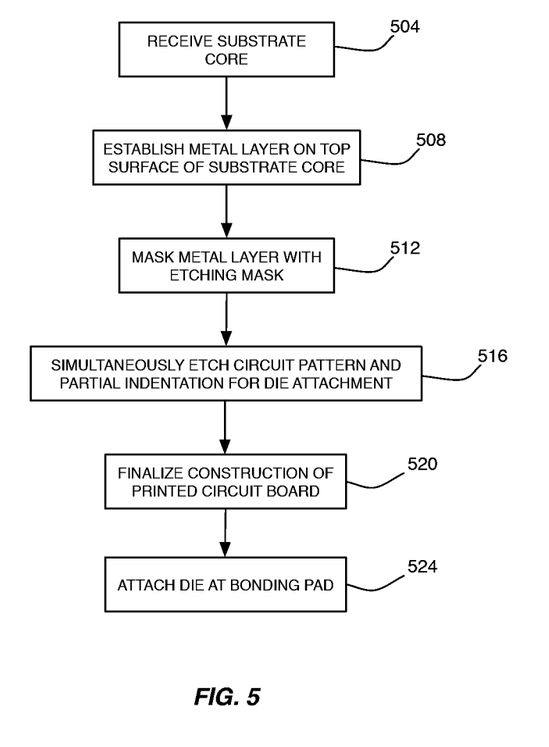
FIG. 5 is a flow chart depicting a method of manufacturing an electronics package in accordance with embodiments of the present disclosure.

After the desired portions of the metal layer(s) 116 have been removed from the substrate core 104, the traces of the circuit have been established, the die attachment anchor 124 has been created, and any other desired portions of the circuit have been constructed (step 520), the method continues by preparing the electronics package 100 for die attachment. Specifically, as seen in FIGS. 3A and 3B, an amount of adhesive 128 may be provided on the bonding pad 120 at least partially covering the die attachment anchor 124. Then, as shown in FIGS. 4A and 4B, at least one die 132 may then be attached to the bonding pad 120 by positioning the at least one die 132 over the bonding pad 120 in contact with the adhesive 128 (step 524).

In some embodiments, the adhesive 128 corresponds to a die attach adhesive such as, for instance, silver paste, non-conductive epoxy, silicone paste, etc. In some embodiments, the adhesive 128 may be deposited over the die attachment anchor 124 in a liquid or semi-liquid form and then the at least one die 132 may be pressed onto the bonding pad 120, thereby squeezing the adhesive 128 into the cavity of the die attachment anchor 124. The adhesive 128 may then be cured using any type of known adhesive curing technique, which may depend upon the type of adhesive 128 employed. As some non-limiting examples, the adhesive 128 may be exposed to a predetermined temperature, light source (e.g., ultraviolet light), chemical, air, etc. for a predetermined amount of time until the adhesive 128 takes on a substantially non-liquid, solid, or semi-solid state. Fortunately, because of the die attachment anchor 124, the adhesion between the die 132 and the bonding pad 120 is not limited to an attachment in a single plane, which means that the likelihood of delamination in that plane is greatly reduced. Furthermore, because the depth of the die attachment anchor 124 is controlled to a specific depth of D2, the possibilities of air bubbles being created in the adhesive 128 is also greatly reduced.

In some embodiments, the at least one die 132 may correspond to any type of semiconductor die, such as an integrated circuit, a semiconductor wafer, an LED, an array of LEDs, a laser diode, an array of semiconductor dies, etc. Where the at least one die 132 corresponds to an LED, the electronics package 100 may be considered a lighting package, as an example.

Although not depicted, the method may continue by finalizing the construction of the electronics package 100. Specifically, any additional finishing steps (e.g., wire bonding, encapsulation, lead forming, lead trimming, singulation, etc.) may be performed after the die 132 has been attached to the bonding pad 120. The step of singulation may occur where batch production of the electronics packages 100 are being employed. Specifically, a plurality of electronics pacakges 100 may be constructed substantially simultaneously on a common substrate or with a substrate core 104 sheet having packages established thereon. The step of singulation may comprise separating or cutting each individual electronics package 100 from the batch and preparing each electronics package 100 for sale, testing, and/or delivery to a customer.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An electronics package, comprising:
   a substrate core;
   at least one metal layer established on the substrate core, the at least one metal layer comprising:
   one or more conductive traces; and
   a bonding pad that is electrically insulated from the one or more conductive traces by an air gap, the bonding pad including a die attachment anchor having a depth that is greater than zero and less than a total thickness of the at least one metal layer; and
   at least one semiconductor die attached to the bonding pad with an adhesive, wherein the adhesive substantially fills the die attachment anchor and establishes a bond between the die attachment anchor and a planar surface of the at least one semiconductor die.

2. The package of claim 1, wherein the depth of the die attachment anchor is between approximately ¼ and ¾ the total thickness of the at least one metal layer.

3. The package of claim 1, wherein the depth of the die attachment anchor is less than approximately ½ the total thickness of the at least one metal layer.

4. The package of claim 1, wherein a width of the die attachment anchor is less than or equal to approximately 0.04 mm.

5. The package of claim 4, wherein the die attachment anchor and the air gap are created during a common etching process with a single etching mask.

6. The package of claim 5, wherein the etching mask used to create the die attachment anchor is configured to prevent etchant from etching the die attachment anchor completely through the at least one metal layer.

7. The package of claim 1, wherein the die attachment anchor is positioned underneath the at least one semiconductor die and wherein the adhesive is sandwiched between the die attachment anchor and the at least one semiconductor die.

8. The package of claim 1, wherein the adhesive comprises at least one of silver paste, non-conductive epoxy, and silicone paste.

9. The package of claim 1, wherein the at least one semiconductor die comprises a Light Emitting Diode (LED).

10. The package of claim 1, wherein the substrate core comprises at least one of a ceramic, a polymer, and a resin and glass fiber laminate and wherein the at least one metal layer comprises at least one of copper, gold, silver, gold-plated copper, and silver-plated copper.

11. An electronic packaging substrate, comprising:
a substrate core;
a metal layer established on the substrate core, the metal layer including a bonding pad with a die attachment anchor having a depth that is greater than zero and less than a total thickness of the metal layer;
a semiconductor die attached to the metal layer at least partially by the die attachment anchor; and
an adhesive sandwiched between the die attachment anchor and the semiconductor die, wherein the adhesive connects the semiconductor die with the metal layer at the die attachment anchor and wherein the adhesive at least partially fills the die attachment anchor to increase a strength of the connection between the semiconductor die and the metal layer.

12. The packaging substrate of claim 11, wherein the adhesive contacts a flat surface of the metal layer beyond the die attachment anchor and wherein the adhesive also contacts a flat surface of the semiconductor die.

13. The packaging substrate claim 11, wherein the adhesive comprises at least one of silver paste, non-conductive epoxy, and silicone paste.

14. The packaging substrate of claim 11, wherein the depth of the die attachment anchor is between approximately ¼ and ¾ the total thickness of the metal layer.

15. The packaging substrate of claim 11, wherein the depth of the die attachment anchor is less than or equal to approximately 0.02 mm and wherein a width of the die attachment anchor is less than or equal to approximately 0.04 mm.

16. The packaging substrate of claim 15, wherein the die attachment anchor is created by chemical etching.

17. The packaging substrate of claim 11, wherein the substrate core comprises at least one of a ceramic, a polymer, and a resin and glass fiber laminate and wherein the at least one metal layer comprises at least one of copper, gold, silver, gold-plated copper, and silver-plated copper.

18. The packaging substrate of claim 11, wherein the metal layer comprises one or more conductive traces.

19. The packaging substrate of claim 18, wherein the bonding pad is electrically insulated from the one or more conductive traces by an air gap.

20. The packaging substrate of claim 19, wherein the die attachment anchor and the air gap are created during a common etching process with a single etching mask.

\* \* \* \* \*